United States Patent [19]
Waller et al.

[11] Patent Number: 5,274,591
[45] Date of Patent: Dec. 28, 1993

[54] SERIAL CLOCK NOISE IMMUNITY IN A SEMICONDUCTOR MEMORY INTEGRATED CIRCUIT HAVING A SERIAL PORT

[75] Inventors: William K. Waller, Boise; James P. Rupp, Meridian, both of Id.

[73] Assignee: Micron Technology, Inc., Boise, Id.

[21] Appl. No.: 929,784

[22] Filed: Aug. 13, 1992

[51] Int. Cl.$^5$ .............................................. G11C 7/00
[52] U.S. Cl. .................. 365/189.05; 365/221; 365/233; 365/194
[58] Field of Search .................. 365/189.05, 221, 206, 365/230.05, 230.09, 233, 193, 194; 307/443, 520, 572

[56] References Cited
U.S. PATENT DOCUMENTS

| | | | |
|---|---|---|---|
| 4,945,516 | 7/1990 | Kashiyama | 365/189.05 |
| 5,018,110 | 5/1991 | Sugiyama | 365/230.09 |
| 5,031,150 | 7/1991 | Ohsawa | 365/193 |
| 5,117,395 | 5/1992 | Hashimoto | 365/221 |

*Primary Examiner*—Eugene R. LaRoche
*Assistant Examiner*—Son Mai
*Attorney, Agent, or Firm*—Michael W. Starkweather

[57] ABSTRACT

A semiconductor memory integrated circuit having a serial port is modified to improve noise immunity on the serial clock (SC) input. This may be achieved by locking out subsequent serial clock signals during a serial port operation. A serial clock lockout signal is derived from the serial timing chain and coupled to the serial clock input one-shot circuit, so as to disable the one-shot circuit beginning in response to an initial serial clock input signal. The serial clock lockout is released, i.e., the one-shot circuit is enabled, after a delay period sufficient for the output terminals to transition to valid states. Alternatively, the one-shot circuit may be replaced by a serial clock lockout latch. The serial clock input signal is gated to the serial clock latch only when a serial clock lockout signal provided by the serial clock lockout latch is not asserted. The serial clock latch output is fed back to the lockout latch for setting the lockout latch in response to an initial serial clock input signal while first ensuring an adequate pulse width for setting the clock latch. Timing of the lockout circuitry may further include providing an SDQ output model for modelling propagation delay in the output portion of the serial port.

20 Claims, 4 Drawing Sheets

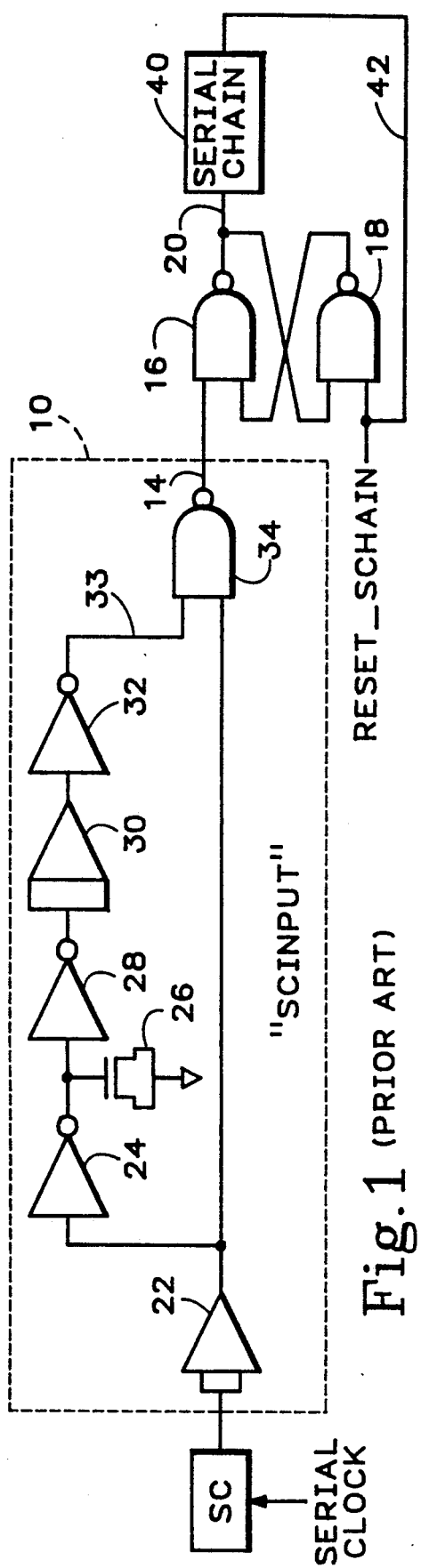
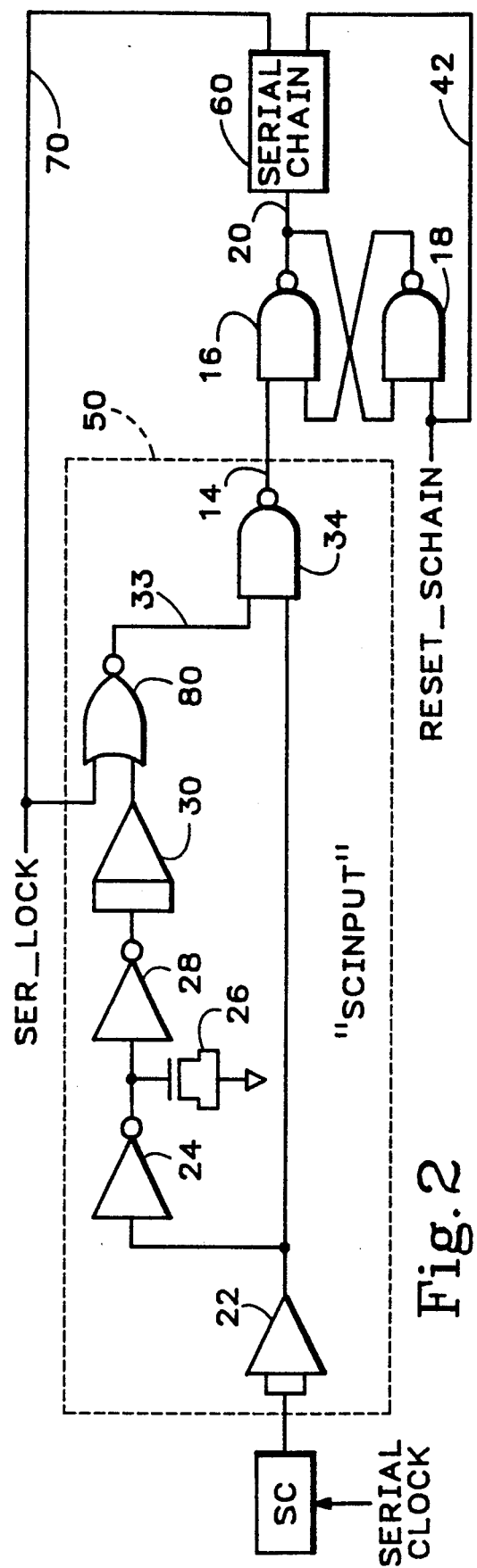
Fig.1 (PRIOR ART)
Fig.2

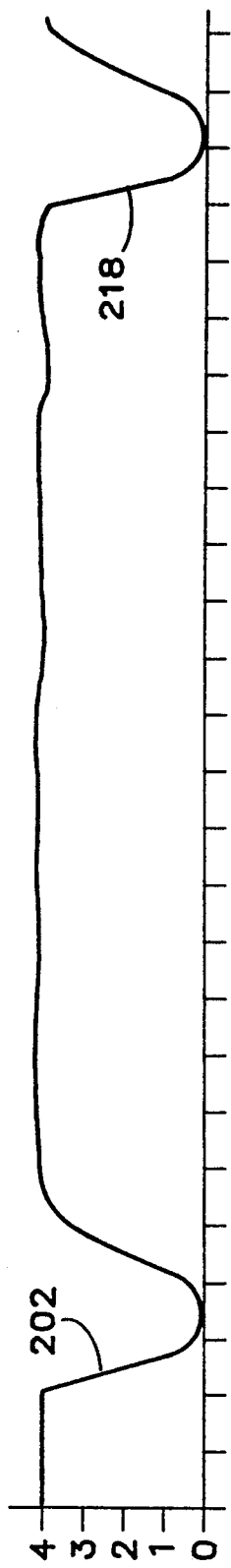
Fig.5D SCP*
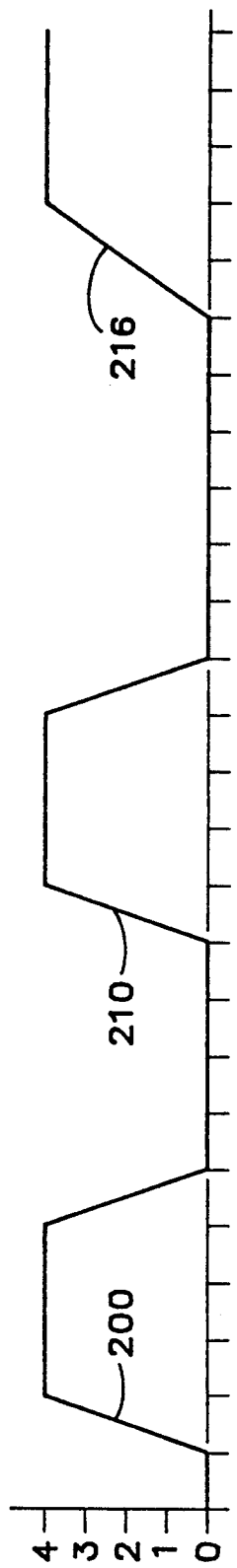
Fig.5E SC
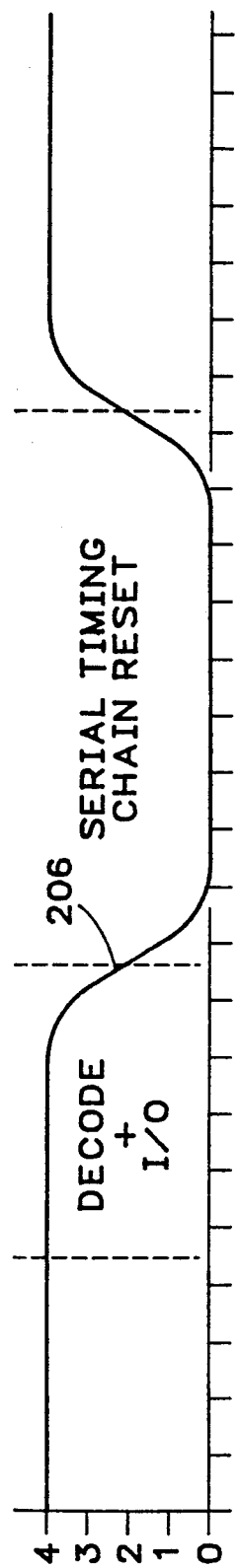
Fig.5F SIM*

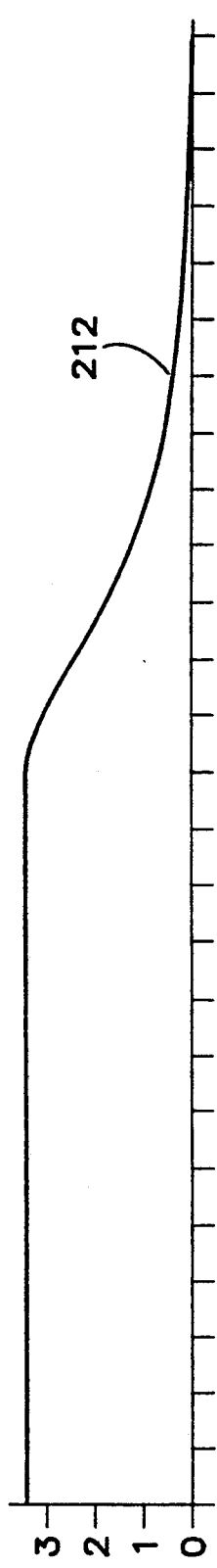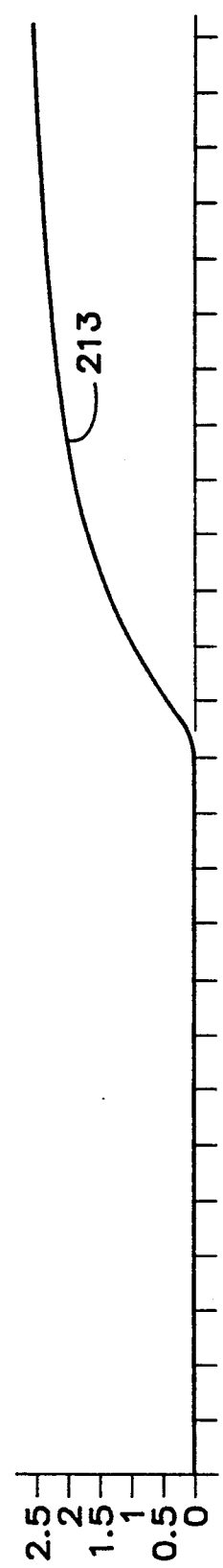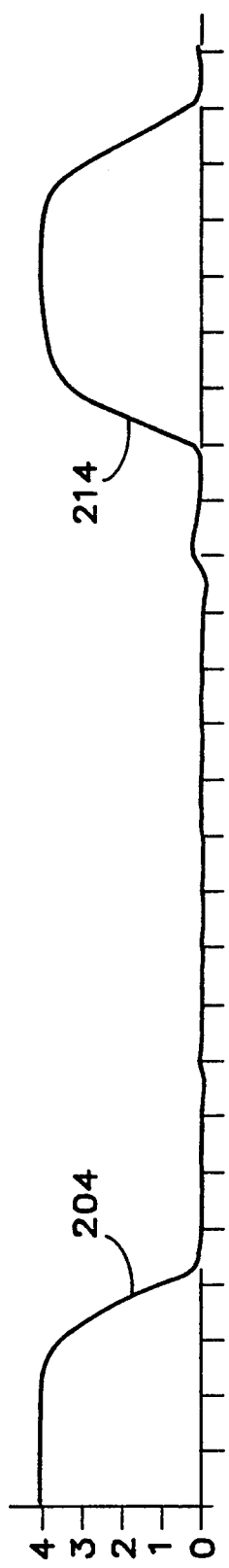

SERIAL CLOCK NOISE IMMUNITY IN A SEMICONDUCTOR MEMORY INTEGRATED CIRCUIT HAVING A SERIAL PORT

FIELD OF THE INVENTION

This invention relates to semiconductor memory integrated circuits and, more particularly to methods, and to circuits for implementing the methods, of locking out the serial clock input signal at selected times during serial port operations to prevent false triggering.

BACKGROUND OF THE INVENTION

A video RAM (VRAM), sometimes called a dual-port RAM, is a dynamic random access memory (DRAM) having a serial I/O port coupled to a serial access memory (SAM). The SAM permits a block of stored data to be rapidly accessed, in a serial fashion, independently of the normal access function of the DRAM. The information in the SAM is normally obtained from, or input into, a primary memory on the VRAM. The primary memory may be configured as a DRAM array and is accessed according to DRAM protocol.

Information may be written into the DRAM at DRAM address speeds and output through the serial access port, or vice versa. This is convenient for video applications, for example, because some address sequences, such as pixels in a raster scan are predetermined.

The serial port allows data to be accessed in sequential order by applying a rising (or falling) edge to a serial clock (SC) input pin. An internal address counter points to a location in the SAM. The SC edge increments the internal counter to the next location in the SAM, and then sends the data value stored in the accessed cell to the output port.

When a false SC clock signal occurs, for example during a read operation, the internal counter is erroneously incremented to the next location, with the result that the output port does not contain correct data. False clock signals during serial write operations cause errors as well. False clock signals typically are caused by either the noise generated by the output switching or by coupling between the SC pin and a switching output. What is needed is a way to prevent false serial clocking in a VRAM serial port without compromising device performance.

SUMMARY OF THE INVENTION

An object of the invention is to prevent false serial clocking in a semiconductor memory.

Another object of the invention is to improve noise immunity in semiconductor memories without sacrificing performance.

Yet another object of the invention is to reduce the size and complexity of serial clock input circuitry in a semiconductor memory integrated circuit.

A further object of the invention is to improve noise immunity in a semiconductor memory in a simple manner that requires a minimum of additional circuitry.

According to one aspect of the invention, an SC lockout circuit is provided to prevent false clocks from affecting the internal counter. Recognition of further SC clock edges after the time of an initial valid SC clock edge is inhibited until after the serial port outputs have transitioned to the appropriate state.

Memory IC devices generally have a serial clock latch for triggering a serial port operation. The serial clock latch is set in response to the serial clock input signal (SC), typically a rising edge. According to one aspect of the present invention, the device includes serial lock circuitry that provides a binary serial clock lockout signal. The lockout signal is characterized by (1) a lockout state, entered in response to an initial serial clock signal, and (2) an inactive or release state, entered into a delay period after the initial clock signal. The delay period is selected to correspond to the execution time of the serial port operation, i.e. the time delay from the serial clock edge to valid output data. The same delay period may be used for write operations.

Gating logic is interposed between the serial clock input and the serial clock latch. The gating logic is responsive to the serial lockout signal for setting the serial clock latch to trigger a second serial port operation responsive to a second serial clock signal subsequent to the initial clock signal only if the serial clock lockout signal is in the released state. The lockout signal thus prevents clocking until the initial operation is substantially completed.

Many semiconductor memory integrated circuits also have a one-shot circuit arranged to provide a pulse responsive to the serial clock signal for setting the serial clock latch. Another aspect of the invention is to provide a serial lockout signal for gating the serial clock, thereby eliminating the one-shot circuit. The disclosed technique prevents a serial clock signal from setting the serial clock latch at least for the period that the serial clock lockout signal is asserted.

Semiconductor memory integrated circuits also have a serial timing chain for timing and control of serial port operations. The serial timing chain also provides a reset signal for resetting the serial clock latch. According to a further aspect of the invention, the new lockout signal is derived from the serial timing chain. Preferably, the serial lock circuitry is coupled to the serial timing chain so as to provide a logic signal characterized by being asserted prior to the reset signal, and by being released after a time period corresponding to the time necessary for output data to propagate through the serial path to the output terminal in a read operation. The same logic may be used to provide the lockout signal during a write operation, as the delay times are approximately the same.

Another aspect of the invention is to obviate the prior art one-shot circuit mentioned above. Known memory circuits typically include a serial path modeling circuit, triggered by the serial clock latch, for providing a strobe sense amp signal a delay period after the SC signal is asserted. This delay allows time for address decoding, charging I/O lines, etc, before strobing the sense amps. According to the present invention, a new serial clock lockout latch provides the serial clock lockout signal. The serial clock lockout latch is set (so as to assert the lockout signal) in response to an initial serial clock (SC) signal. Logic circuitry responsive to the strobe sense amp signal is used to reset the serial clock lockout latch.

A further aspect of the invention is to model the time for propagation of serial output data from the sense amps to the output terminals. Circuitry for modeling this period, called the SDQ output model, is triggered to commence the delay period in response to the strobe sense amp signal. The output of the SDQ output model thus changes state after a time sufficient for the output terminal to transition to a valid state. The SDQ output model is coupled to the serial lockout latch for resetting the latch, so that the serial port is "unlocked" after the output transitions, thus ensuring substantial completion of the current serial operation before acknowledging a new serial clock signal. Noise on the SC input at inappropriate times thus is ignored.

The foregoing and other objects, features and advantages of the invention will become more readily apparent from the following detailed description of a preferred embodiment which proceeds with reference to the drawings.

BRIEF DESCRIPTION OF THE DRAWINGS

FIG. 1 is a partial schematic, partial block diagram of selected prior art serial port circuitry in a semiconductor memory device.

FIG. 2 is a partial schematic, partial block diagram of serial port circuitry in a semiconductor memory device according to one embodiment of the present invention.

FIGS. 5A through 5F are timing diagrams showing selected waveforms to illustrate operation of the circuitry of FIG. 3.

DETAILED DESCRIPTION OF THE PREFERRED EMBODIMENT

Figure 3:
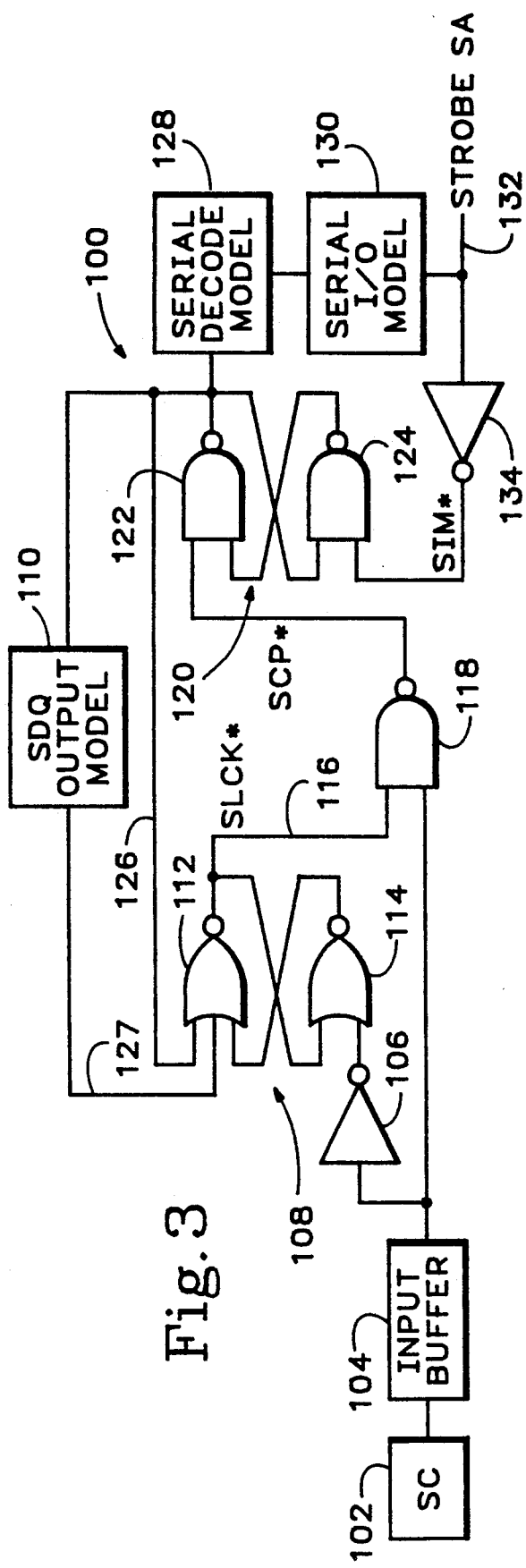
FIG. 3 is a partial schematic, partial block diagram illustrating an alternative embodiment of the invention.

FIG. 1 illustrates typical serial clock circuitry in a semiconductor memory device such as a VRAM. The serial clock input signal (SC), generally applied to the device from an external source, is used to initiate serial input (Write) and serial output (Read) operations. It is a binary logic signal, having voltage and drive characteristics compatible with the particular memory device family of interest.

The SC signal is applied to an input terminal of a "one-shot" circuit 10 called "SCINPUT" (serial clock input), further described below. A rising edge on the SC signal results in a negative pulse at the output node 14 of one-shot circuit 10. Output node 14 is coupled to a serial clock latch comprising, for example, a cross-coupled pair of NAND gates 16,18. The negative pulse at node 14 sets the serial clock latch output, node 20, to a logic '1'. The latch output 20 is provided to serial timing chain logic 40 which provides timing and control signals for executing a serial operation, as is known in the IC memory prior art.

In the prior art example of FIG. 1, one-shot circuit 10 includes an input buffer 22, coupled to a first input of a NAND gate 34 and to a first inverter 24. Inverter 24 in turn is coupled to a capacitor 26 and to a second inverter 28. Inverters 24,28 and capacitor 26 together form a delay element. The second inverter 28 is coupled through another delay element 30 to a third inverter 32. Finally, the third inverter 32 has an output node 33 coupled to the other input of NAND gate 34, so that the foregoing circuit elements together form a one-shot circuit. In operation, SC is normally low so the output of buffer 22 also is normally low. The one-shot is rising edge triggered. The SC input signal is inverted thrice (24,28,32), so the second input to NAND 34, i.e. node 33, is normally high. However, the normally low signal at the first input to the NAND gate (output of buffer 22) forces NAND output 14 normally high.

In operation, a rising edge on SC enables NAND 34 so that the state of its output, node 14, depends upon the second input, node 33, so node 14 immediately goes low. Inverters 24,28 and 32, and delay 30, subsequently drive node 33 low so node 14 returns high after a predetermined delay period. This provides a negative pulse at node 14 for each rising edge of SC, provided the frequency of SC is slower than the one-shot output pulse width. This circuit suffers the disadvantages of having several delay elements, which occupy substantial silicon area and complicate fabrication. It is also challenging to design the one-shot circuit so as to ensure sufficient output pulse width to set the serial clock latch, without degrading performance by unduly slowing operation.

The serial timing chain logic 40 also provides a reset signal "RESET_SCHAIN" at node 42 (active low), which is fed back to the serial clock latch circuit 16,18 for clearing the latch in preparation for the next serial clock cycle. The reset signal is asserted at an intermediate point during a serial port operation. Thereafter, the serial clock latch output 20 remains low until a subsequent SC clock edge triggers a pulse out of the one-shot circuit 10. A problem with the circuitry of FIG. 1 is that noise on the SC input may trigger the one-shot 10 inadvertently, thereby setting the serial clock latch to begin a new operation prematurely, i.e. before the preceding operation is completed. This can lead to erroneous operation.

FIRST EMBODIMENT OF THE INVENTION

FIG. 2 shows serial clock circuitry modified according to the present invention. The circuit of FIG. 2 has some elements in common with FIG. 1, with like reference numbers used to identify common elements. The differences are described as follows. In a modified one-shot circuit 50, the second delay element 30 drives a first input to a NOR gate 80, which in turn controls the NAND gate 34. A new binary lockout signal, labeled "SER_LOCK" (Serial Lockout) is input to the other input of NOR gate 80. The new serial lockout signal has a lockout state and a release state. In the lockout state, this signal isolates the serial clock latch from the SC input by disabling the one-shot circuit. Specifically, it prevents the one-shot from firing in response to a serial clock signal edge as long as the serial lockout signal, further described below, is asserted.

The serial lockout signal SER_LOCK conveniently is provided by the serial timing chain logic. It may be derived by selecting a logic signal (or providing a boolean combination of logic signals) among the serial timing chain logic that is asserted earlier in the cycle than the serial chain reset signal ("RESET_SCHAIN" of FIG. 1). This will prevent a spurious SC clock signal from setting the serial clock latch, even if it occurs immediately after the serial clock latch has been reset. (A spurious clock edge before reset effectively is ignored by the serial clock latch). The serial lockout signal remains asserted until the serial outputs have transitioned to valid levels. Preferably, the serial lockout signal is released after the serial outputs have transitioned to approximately 70 to 80 percent of full voltage swing. The remainder of the output transition follows a relatively slow RC curve and therefore is less noisy than the initial switching, so it is unlikely to cause false clocking.

ALTERNATIVE EMBODIMENT

FIG. 3 shows an alternative embodiment of the invention, designed to obviate the prior art one-shot circuit (10 in FIG. 1). Here, a different approach is used to ensure an adequate pulse width for setting the serial clock latch, while providing the new "serial lock" feature to improve noise immunity.

Referring to FIG. 3, serial clock circuitry 100 generally comprises a serial clock lockout latch for providing a serial lockout signal, serial clock gating logic, serial clock latch, and timing model circuits. The serial clock signal SC is provided at input terminal 102. SC input 102 is coupled through an input buffer 104. Input buffer 104 is coupled to an inverter 106 and to the first input of a NAND gate 118. A first NOR gate 112 is cross-coupled to a second NOR gate 114 so as to form the serial clock lockout latch 108. This latch provides the serial lockout signal SLCK* at node 116. The output of inverter 106 is coupled to one input of NOR gate 114, while the serial lockout signal SLCK* is fed back to the second input to NOR 114, and to the second input to NAND gate 118. The latch need not necessarily be formed of NOR gates. For example, if the SC input signal be inverted, a latch may be formed of NAND gates.

The serial lockout signal SLCK* (node 116) is coupled to NAND gate 118 for gating the SC input signal to the serial clock latch. The output of NAND gate 118 is a serial clock pulse signal SCP*. A pair of NAND gates 122, 124 are cross-coupled to form the serial clock latch as before. SCP* is input and NAND gate 122 for setting the latch.

The serial clock latch output (node 126) also is provided to a serial decode model circuit 128, which models a delay period for address decoding. The serial decode model circuit, in turn, drives a serial I/O model circuit 130, which models a delay period for forming data on the I/O lines. The serial decode and serial I/O models 128,130 together thus model a path indicated by 140 in FIG. 4. Accordingly, these circuits indicate the completion of a time period that begins at the outset of a serial cycle and is adequate for address decoding, and charging the serial I/O lines. Details of these modeling circuits are known. The output of serial I/O model 130 is a strobe sense amp ("STROBE SA") signal, node 132, which is used to strobe the sense amps (152 in FIG. 4). The STROBE SA signal also is fed back through an inverter 134 (SIM*) to NAND gate 124 for resetting the serial clock latch 122, 124.

Another aspect of the invention is to model the serial output circuitry for timing the new serial lockout signal. In the prior art, output of serial data is generally asynchronous downstream of the sense amps (aside from output enable gating). Thus, there was no need to model the output stages for timing purposes. We have provided such a model, the "SDQ OUTPUT MODEL" 110 for timing the serial lock feature, as further described below.

Figure 4:
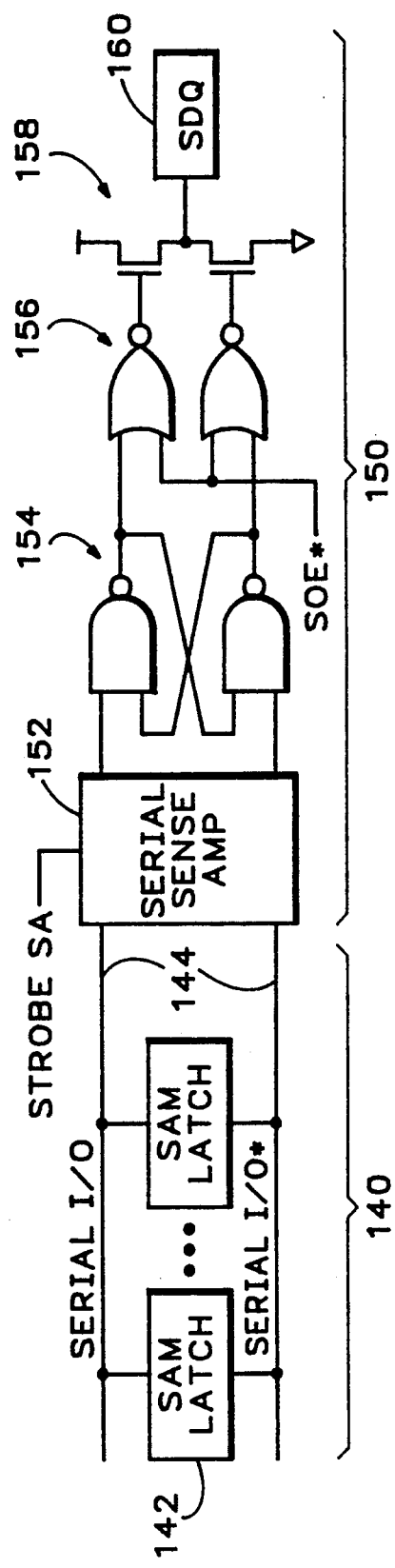
FIG. 4 is a partial schematic, partial block diagram illustrating known serial port circuitry modeled by the model circuitry of FIG. 3.

FIG. 4 illustrates generally the circuitry emulated by the various model circuits, as follows. Semiconductor memory serial ports include a serial access memory or SAM register comprising a series of SAM latches, for example SAM latch 142. The SAM latches are coupled to a pair of serial I/O lines 144. At least a minimum amount of time is necessary for accessing the SAM latches and developing voltage on the serial I/O lines (data) for a read operation. This time is modeled, for timing purposes, by the serial decode model circuitry 128 and serial I/O model circuitry 130 of FIG. 3.

The serial I/O lines (for each bit) are coupled to a serial sense amp 152. The sense amp is controlled by the STROBE SA signal. The serial port further includes a latch 154 coupled to the serial sense amp 152 to latch serial output data. The output data from latch 154 is coupled through serial output enable logic 156 to output driver devices 158. Finally, a serial output terminal or pin 160 is coupled to the output driver devices 158. The path from the serial sense amp 152 to the output terminal 160, generally indicated by reference number 150, also takes at least a minimum period of time for output data to propagate. This output propagation time is modeled by the new SDQ OUTPUT MODEL 110 of FIG. 3, as noted above. The SDQ OUTPUT MODEL may be formed by a series of gates, for example inverters, having the same number of gate delays as the output path 150. Gates 134, 124 and 122 also form part of this model.

SDQ OUTPUT MODEL 110 is coupled between the serial clock latch output (node 126) and a second input to NOR gate 112, i.e. node 127, for resetting the lockout latch to release the lockout signal after the output terminals have transitioned to valid levels. The SDQ output model provides a falling edge delay.

The serial clock latch output, node 126, also is coupled to the lockout latch (NOR gate 112—first input). This ensures an adequate pulse width at SCP* for setting the clock latch, because it is the clock latch output itself (node 126) that sets the lockout latch, which in turn drives NAND gate 118 high, terminating the SCP* pulse. This sets the lockout signal as soon as possible after the SC rising edge, while ensuring that the clock latch is set to execute the operation. A falling edge delay element (not shown) may be interposed between the serial clock latch and the lockout latch (NOR 112) to adjust the timing. The SDQ output model 110 reinforces the lockout, and maintains it until the outputs have sufficient time to transition.

OPERATION

Operation of the circuit of FIG. 3 is illustrated in the timing diagrams of FIG. 5. FIG. 5 shows the following six signals: SDQ1 and SDQ2 are complementary serial data output signals provided to a serial output terminal (160 in FIG. 4). SLCK* (serial lock) is the serial lockout signal at node 116 in FIG. 3. SCP* (serial clock pulse) appears at the output of NAND gate 118 in FIG. 3. SC is the serial clock input signal applied at input terminal 102. Finally, SIM* appears at the output of inverter 134 in FIG. 3, so it is essentially a complement of the sense amp strobe signal STROBE SA (132).

Initial SC Input Signal

Referring now to FIG. 5E, SC exhibits an initial rising edge 200 to initiate a serial port operation. SCP* exhibits a falling edge 202 (FIG. 5D) in response to the SC signal. Referring to FIG. 3, SCP* low drives gate 122 high thereby setting the serial clock latch 120, so that node 126 is high. Node 126 is fed back to one of the inputs to NOR gate 112, so SLCK* goes low (204) after the serial clock latch has been set (see FIG. 5C). The serial lock is now in effect, as the serial lock signal SLCK* is asserted low.

Serial Operation

The serial clock latch pulse at node 126 triggers the serial timing chain (not shown in FIG. 3) to initiate the desired serial port operation, and triggers the timing models 128 and then 130. The serial decode model and the serial I/O model together model a sufficient time delay for output data to form on the I/O lines. Then STROBE SA (132) is asserted (high), so SIM* goes low (FIG. 5F), resetting the serial clock latch (120). Hence, node 126 goes low.

However, a second input to NOR gate 112, i.e. node 127, is provided by the SDQ OUTPUT MODEL 110. Node 127 is normally low. The low pulse on SCP* is coupled through NAND gate 122 to drive node 126 high. Node 126 high in turn drives SLCK* low (node 116). Since SC is high, SLCK* is latched low (204) in latch 112, 114. The circuitry thus enters a stable state in which SLCK* remains low. False clock signals are ignored. After the delay, selected to model transition time of the serial outputs, node 127 goes low and SLCK* goes high, thereby releasing the serial lock.

Specifically, the serial decode model circuit 128 is coupled to the serial clock latch to provide a first delay period beginning upon initiation of a serial port operation. The serial I/O model circuit 130 is coupled to the serial decode model circuit so that the serial I/O model provides the strobe sense amp signal (STROBE SA) after a second delay period. The STROBE SA signal propagates through inverter 134, latch 122,124 and provides a falling edge at node 126. The SDQ output model 110 further delays the falling edge so as to allow release of the lockout signal SLCK* only after a delay sufficient for valid output data to form.

False SC Clock Signal

Referring now to FIG. 5E, a second SC rising edge 210 is shown. This represents a false edge resulting rom noise on the SC input. It may result, for example, from cross-talk from the SDQ output terminals beginning to change state, particularly in applications where the SDQ pins are adjacent the SC input terminal. Referring to FIG. 3, the SC edge does not affect the serial clock latch (108) state, although NOR 114 goes high, because node 127 already is high.

While the output data is forming a second rising edge 210 occurs on the SC signal. This edge occurs too soon to be a valid serial clock signal. It may be the result of noise resulting from a transition on another pin adjacent the SC input pin. The SC rising edge 210 cannot change the state in the NOR latch (112, 114) because node 127 is high and holds SLCK* low for the period of time determined by the SDQ OUTPUT MODEL 110. Additionally, since SLCK* is low, NAND gate 118 is effectively disabled to prevent the SC clock signal from setting latch 122, 124. This SC clock signal thus is ignored.

Completing the Initial SC Clock Cycle

The SCP* negative pulse latches a lat node 126, which triggers the serial decode model 128 to provide a first predetermined delay period. The output of the serial decode model drives the serial I/O model 130 which provides a I/O model delay period. Upon a conclusion of the time delays provided by the serial decode model and the serial I/O model, the STROBE SA signal at 132 goes high, which drives SIM* low at 206. During these delay periods, the current serial address is decoded to access the appropriate address, and signals provided by the SAM latch form on the serial I/O lines. Then the SDQ1 and SDQ2 transition to the current states indicated by the previously stored data.

Second Valid SC Clock Signal

After a time sufficient for the output data to form on SDQ1 and SDQ2, at least to 70 or 80 percent of full swing, indicated in 212,213 (FIGS. 5A,5B respectively), the lockout signal SLCK* goes high 214 (FIG. 5C). Thereafter, another rising edge 216 is applied to the SC signal. Since SLCK* is now high, the SCP* goes low (218) which in turn sets the serial clock latch 120 to begin the next valid cycle. The foregoing process is repeated with respect to each cycle of the serial clock input signal.

Advantages

The invention has the advantages of obviating the one-shot circuit of prior art, thereby reducing complexity of design and chip area. The pulse width (SCP*) necessary to latch the serial clock latch no longer need be finely determined and designed into the IC. Rather, feedback from the serial clock latch (126) is used to set the new serial lock, thereby assuring that just enough time has elapsed to set the serial clock latch before invoking the serial lock. The circuit, in that regard, is self-calibrating so as to optimize performance. The new SDQ output modeling feature ensures that the serial lock is released immediately after the outputs transition to valid levels, again automatically optimizing performance by locking out the SC clock just long enough to form valid outputs from the last valid clock. The circuit of FIG. 2 offers a serial lock feature with minimal modification to existing designs.

Having illustrated and described the principles of my invention in a preferred embodiment thereof, it should be readily apparent to those skilled in the art that the invention can be modified in arrangement and detail without departing from such principles. We claim all modifications coming within the spirit and scope of the accompanying claims.

We claim:

1. A semiconductor memory integrated circuit having a serial port and comprising:
   input means for receiving a serial clock (SC) input signals;
   a serial clock latch (16,18) for initiating serial port operations in response to the serial clock input signals;
   serial lockout means for providing a binary serial clock lockout signal (SER_LOCK) characterized by an active state entered in response to an initial clock signal applied to the input means and by an inactive state entered into a delay period after the initial clock signal, the delay period being selected to correspond to an execution time of a serial port operation; and
   gating means (34) interposed between the input means and the serial clock latch and responsive to the serial lockout signal for setting the serial clock latch to initiate a serial port operation responsive to a second serial clock signal received subsequent to the initial clock signal only if the serial clock lockout signal is in the inactive state.

2. A semiconductor memory integrated circuit according to claim 1 further comprising:

a one-shot circuit (50) arranged to provide a serial clock pulse responsive to the serial clock input signal for setting the serial clock latch; and logic means (80) for disabling the one-shot circuit responsive to the serial clock lockout signal, thereby preventing a serial clock signal from setting the serial clock latch while the serial clock lockout signal is asserted.

3. A semiconductor memory integrated circuit according to claim 1 further comprising a serial timing chain (60), the serial timing chain providing a reset signal (RESET_SCHAIN) for resetting the serial clock latch (16,18); and wherein the serial lockout means includes means coupled to the serial timing chain so as to assert the serial clock lockout signal prior to asserting the reset signal, and release the lockout signal after a delay period selected to allow serial data to propagate through the serial port.

4. A semiconductor memory integrated circuit comprising:

input means (102) for receiving a serial clock (SC) input signal;

a serial clock latch (122,124) for triggering a serial port operation;

serial lockout means (112,114) responsive to an initial serial clock input signal for asserting a serial lockout signal (SLCK*);

gating means (118) disposed between the serial clock input means and the serial clock latch, for gating the serial clock input signal so as to set the serial clock latch responsive to an SC input signal only while the serial lockout signal (SLCK*) is not asserted; and means for modeling a serial port propagation delay time;

the serial lockout means being responsive to the modeling means so as to release the serial lockout signal upon a conclusion of the modeled delay time, thereby allowing a subsequent serial clock input signal to set the serial clock latch for initiating a subsequent serial port operation.

5. A semiconductor memory integrated circuit according to claim 4 further comprising an output path (150) including a plurality of sense amps (152) and a serial output terminal (160), and wherein the modeling means includes:

a serial decode model circuit (128) coupled to the serial clock latch to provide a first delay period beginning upon said initiation of a serial port operation;

a serial I/O model circuit (130) coupled to the serial decode model circuit to provide a strobe sense amp signal (STROBE SA) after a second delay period; and an SDQ output model circuit (110) responsive to the strobe sense amp signal for modeling an output path delay time from the sense amps to the output terminal.

6. A semiconductor memory integrated circuit according to claim 4 wherein the serial lockout means includes a serial lockout latch formed of a cross-coupled pair of logic gates.

7. A semiconductor memory integrated circuit according to claim 6 wherein:

the gating means includes a logic gate having a first input coupled to the input means and having the other input coupled to the serial lockout latch to receive the serial lockout signal, the output of the logic gate providing a serial clock pulse signal (SCP*) for setting the serial clock latch.

8. A semiconductor memory integrated circuit according to claim 4 wherein:

the serial lockout means includes a cross-coupled latch; and the modeling means includes an SDQ output model circuit coupled to the serial clock latch for releasing the cross-coupled latch a predetermined delay period after the serial clock latch is reset.

9. A semiconductor memory integrated circuit according to claim 1 wherein the serial lockout means includes a serial lockout latch for providing the serial lockout signal;

the serial clock latch output is coupled to the serial lockout latch for setting the lockout latch to assert the lockout signal in response to the clock latch having been set, thereby asserting the lockout signal as soon as possible while ensuring an adequate time for setting the clock latch before asserting the lockout signal.

10. In a semiconductor memory integrated circuit having a serial port, a serial clock (SC) input terminal for receiving a serial clock input signal and having a serial clock latch for initializing a serial port operation, a method of improving noise immunity at the SC input terminal comprising the steps of:

responsive to an initial SC input signal, setting the serial clock latch to initialize a serial port operation;

modeling a time period for execution of the serial port operation, said modeling beginning in response to the initial SC input signal; and during the modeled time period, isolating the SC input signal from the serial clock latch to prevent false triggering from noise on the SC input terminal.

11. A method according to claim 10 wherein said isolating step includes:

providing a logic gate having one input of the logic gate coupled to receive the SC input signal and the output of the logic gate coupled to set the serial clock latch;

providing a binary serial lockout signal coupled to the other input of the logic gate for controllably gating the SC input signal, the lockout signal having a lockout state and a release state;

asserting the lockout signal to the lockout state, thereby preventing the SC input signal from propagating through the logic gate to set the serial clock latch; and upon a conclusion of the modeling period, releasing the serial lockout signal so as to gate a subsequent SC input signal through the logic gate for setting the serial chain latch to initiate a serial port operation.

12. A method according to claim 11 wherein the lockout signal is asserted to the lockout state in response to the serial clock latch switching to a predetermined state for initiating a serial port operation.

13. A method according to claim 11 wherein the lockout signal is released after a delay period adequate for data output to transition to a valid output voltage level.

14. A method according to claim 13 further comprising:

wherein releasing the serial lockout signal includes:

modeling a first time period adequate for address decoding and for forming data on the I/O lines;

modeling a second time period adequate for output data to propagate from the sense amps to the SDQ output terminal; and releasing the serial lockout signal a period of time equal to the sum of the first and second time periods after the initial serial clock input signal.

15. A method according to claim 14 further comprising:

selecting the second time period so as to allow the output terminal to transition to within a range of approximately 70-80 percent of full voltage swing.

16. A method according to claim 11 wherein providing a lockout signal includes:

providing a serial clock lockout latch; and coupling the serial clock latch output back to the lockout latch so as to set the lockout latch to the lockout state in response to the serial clock latch switching to a predetermined state indicating initiation of a serial port operation, whereby the lockout signal is asserted immediately after the serial clock latch changes state.

17. A method according to claim 10 wherein the serial port includes a serial chain for providing a strobe sense amp signal and said modeling an execution time period includes the steps of:

providing an SDQ model circuit for modeling an output propagation time;

triggering the SDQ model circuit in response to the strobe sense amp signal; and coupling the SDQ model circuit to the serial clock lockout latch so as to reset the lockout latch upon completion of the output propagation time after the strobe sense amp signal is asserted, thereby releasing the serial lock after the output data is valid.

18. A method according to claim 10, the memory integrated circuit having a serial clock SC input terminal and a one-shot circuit responsive to the serial clock signal for activating serial chain logic to execute a serial read operation, wherein the SC input terminal comprising the steps of:

asserting a binary lockout signal in response to a first edge of the SC clock signal to begin an initial read operation;

coupling the binary lockout signal to the one-shot circuit so as to disable the one-shot circuit during said first state of the binary lockout signal; and after a delay period, releasing the binary lockout signal so as to enable the one-shot circuit for triggering in response to a subsequent edge of the SC clock input signal to begin a subsequent read operation, thereby preventing triggering the one-shot circuit during the delay period.

19. A method according to claim 18 wherein the serial port includes a sense amp and an output terminal, and a serial chain for providing a strobe sense amp signal and said releasing the binary lockout signal includes:

modeling a serial port output path from the sense amp to the serial output terminal to determine an output propagation delay time period; and responsive to the strobe sense amp signal, and delayed by the output propagation delay time period thereafter, releasing the lockout signal so as to enable the one-shot circuit.

20. A method according to claim 18 wherein said providing a binary lockout signal includes providing a lockout signal latch comprising a cross-coupled pair of gates and having a set input coupled to the SC input signal and having a reset input coupled to the strobe sense amp signal through a delay means.

* * * * *